US011575016B2

(12) United States Patent
Huang

(10) Patent No.: US 11,575,016 B2
(45) Date of Patent: Feb. 7, 2023

(54) METHOD FOR FABRICATING A SEMICONDUCTOR DEVICE WITH A PROGRAMMABLE CONTACT

(71) Applicant: NANYA TECHNOLOGY CORPORATION, New Taipei (TW)

(72) Inventor: Chin-Ling Huang, Taoyuan (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 8 days.

(21) Appl. No.: 17/319,347

(22) Filed: May 13, 2021

(65) Prior Publication Data

US 2021/0265476 A1    Aug. 26, 2021

Related U.S. Application Data

(62) Division of application No. 16/734,869, filed on Jan. 6, 2020, now Pat. No. 11,081,562.

(51) Int. Cl.
*H01L 29/423* (2006.01)
*H01L 21/28* (2006.01)
(Continued)

(52) U.S. Cl.
CPC ............ *H01L 29/42376* (2013.01); *H01L 21/823418* (2013.01); *H01L 21/823814* (2013.01);
(Continued)

(58) Field of Classification Search
CPC ......... H01L 29/08; H01L 29/49; H01L 29/66; H01L 29/417; H01L 29/42376; H01L 29/41725; H01L 29/41791; H01L 29/435; H01L 29/423; H01L 29/42316; H01L 29/086; H01L 29/495; H01L 29/42312; H01L 29/42364; H01L 29/4933; H01L 29/0843; H01L 29/0891; H01L 29/518; H01L 29/4958; H01L 29/4966; H01L 29/4975; H01L 29/4011; H01L 29/66515; H01L 29/66636; H01L 29/66643; H01L 29/66537; H01L 29/66575; H01L 29/66598; H01L 29/1041; H01L 29/1045; H01L 27/092; H01L 21/8234; H01L 21/8238; H01L 21/823425; H01L 21/823456; H01L 21/823418; H01L 21/823437; H01L 21/823828; H01L 21/82385; H01L 21/823814; H01L 21/32053; H01L 21/32051;
(Continued)

(56) References Cited

U.S. PATENT DOCUMENTS 6,423,632 B1    7/2002  Samavedam et al.
2005/0112813 A1*  5/2005  Kim ..................... G09G 3/3241
                                                   257/E21.59
(Continued)

*Primary Examiner* — Chuong A Luu
(74) *Attorney, Agent, or Firm* — Muncy, Geissler, Olds & Lowe, P.C.

(57) ABSTRACT

The present application discloses a method for fabricating a semiconductor device includes providing a substrate, forming a gate stack on the substrate and a pair of heavily-doped regions in the substrate, forming a programmable contact having a first width on the gate stack, and forming a first contact having a second width, which is greater than the first width, on one of the pair of heavily-doped regions.

6 Claims, 17 Drawing Sheets

(51) Int. Cl.
    *H01L 29/51*     (2006.01)
    *H01L 29/49*     (2006.01)
    *H01L 29/417*     (2006.01)
    *H01L 21/8234*     (2006.01)
    *H01L 21/8238*     (2006.01)
    *H01L 27/092*     (2006.01)

(52) U.S. Cl.
    CPC ........ *H01L 27/092* (2013.01); *H01L 29/4011* (2019.08); *H01L 29/41725* (2013.01); *H01L 29/41791* (2013.01); *H01L 29/42316* (2013.01); *H01L 29/42364* (2013.01); *H01L 29/4933* (2013.01); *H01L 29/518* (2013.01); *H01L 2924/1304* (2013.01)

(58) Field of Classification Search
    CPC ......... H01L 21/28097; H01L 21/28088; H01L 21/28079; H01L 21/28061; H01L 2924/1304; H01L 21/28; H01L 29/78; H01L 29/51; H01L 29/7833; H01L 29/4232; H01L 29/66477; H01L 23/485; H01L 23/522; H01L 23/525; H01L 23/532; H01L 23/5226; H01L 23/53276; H01L 23/5256; H01L 27/0207; H01L 27/11206; H01L 2221/1094
    USPC .......................................................... 438/300
    See application file for complete search history.

(56) References Cited

U.S. PATENT DOCUMENTS

| | | | |
|---|---|---|---|
| 2006/0110844 A1* | 5/2006 | Lee | H01L 21/187 |
| | | | 257/E27.128 |
| 2010/0123203 A1* | 5/2010 | Bhuwalka | H01L 29/7391 |
| | | | 257/402 |
| 2015/0048439 A1 | 2/2015 | Shum | |
| 2019/0067270 A1 | 2/2019 | Feng | |

* cited by examiner

METHOD FOR FABRICATING A SEMICONDUCTOR DEVICE WITH A PROGRAMMABLE CONTACT

CROSS-REFERENCE TO RELATED APPLICATION

This application is a divisional application of U.S. Non-Provisional application Ser. No. 16/734,869 filed Jan. 6, 2020, which is incorporated herein by reference in its entirety.

TECHNICAL FIELD

The present disclosure relates to a method for fabricating a semiconductor device, and more particularly, to a method for fabricating a semiconductor device with a programmable contact.

DISCUSSION OF THE BACKGROUND

Semiconductor devices are used in a variety of electronic applications, such as personal computers, cellular telephones, digital cameras, and other electronic equipment. The dimensions of semiconductor devices are continuously being scaled down to meet the increasing demand of computing ability. However, a variety of issues arise during the scaling-down process, and such issues are continuously increasing in frequency and impact. Therefore, challenges remain in achieving improved quality, yield, performance, and reliability and reduced complexity.

This Discussion of the Background section is provided for background information only. The statements in this Discussion of the Background are not an admission that the subject matter disclosed in this section constitutes prior art to the present disclosure, and no part of this Discussion of the Background section may be used as an admission that any part of this application, including this Discussion of the Background section, constitutes prior art to the present disclosure.

SUMMARY

One aspect of the present disclosure provides a semiconductor device including a substrate, a gate stack positioned on the substrate, a plurality of programmable contacts positioned on the gate stack, a pair of heavily-doped regions positioned adjacent to two sides of the gate stack and in the substrate, and a plurality of first contacts positioned on the pair of heavily-doped regions. A width of the plurality of programmable contacts is less than a width of the plurality of first contacts.

In some embodiments, the gate stack comprises a gate insulating layer positioned on the substrate, a gate bottom conductive layer positioned on the gate insulating layer, and a gate top conductive layer positioned on the gate bottom conductive layer.

In some embodiments, the semiconductor device o further comprises a pair of first spacers attached to sidewalls of the gate insulating layer and sidewalls of the gate bottom conductive layer.

In some embodiments, the gate insulating layer has a thickness between about 0.5 nm and about 5.0 nm, and the gate insulating layer is formed of silicon oxide, silicon nitride, silicon oxynitride, or silicon nitride oxide.

In some embodiments, the gate bottom conductive layer has a thickness between about 50 nm and about 300 nm, and the gate bottom conductive layer is formed of doped polysilicon.

In some embodiments, the gate top conductive layer has a thickness between about 2 nm and about 50 nm, and the gate top conductive layer is formed of a metal silicide.

In some embodiments, the semiconductor device o further comprises a pair of lightly-doped regions positioned adjacent to the pair of heavily-doped regions and in the substrate.

In some embodiments, a ratio of the width of the plurality of programmable contacts and a width of the gate top conductive layer is between about 1:2 and about 1:10.

In some embodiments, the semiconductor device o further comprises a pair of second spacers attached to sidewalls of the pair of first spacers.

In some embodiments, the semiconductor device o further comprises a plurality of air gaps positioned between the plurality of programmable contacts.

In some embodiments, the gate insulating layer comprises a center portion and two end portions, wherein the two end portions have a greater concentration of oxygen than the center portion.

Another aspect of the present disclosure provides a semiconductor device including a substrate, a gate stack positioned on the substrate, a plurality of programmable contacts positioned on the gate stack, a pair of stress regions positioned adjacent to two sides of the gate stack and in the substrate, and a plurality of first contacts positioned on the pair of stress regions. A width of the plurality of programmable contacts is less than a width of the plurality of first contacts.

Another aspect of the present disclosure provides a method for fabricating a semiconductor device including providing a substrate, forming a gate stack on the substrate and a pair of heavily-doped regions in the substrate, forming a programmable contact having a first width on the gate stack, and forming a first contact having a second width, which is greater than the first width, on one of the pair of heavily-doped regions.

In some embodiments, forming the gate stack on the substrate comprises: forming a gate insulating layer on the substrate; forming a gate bottom conductive layer on the gate insulating layer; and forming a gate top conductive layer on the gate bottom conductive layer.

In some embodiments, forming the programmable contact having the first width on the gate stack comprises: forming catalyst units on the gate top conductive layer; and growing the catalyst units into the programmable contact.

In some embodiments, forming the gate top conductive layer on the gate bottom conductive layer comprises: forming a gate top conductive film over the substrate and the gate bottom conductive layer; performing an annealing process to form the gate top conductive layer; and performing a removal process.

In some embodiments, growing the catalyst units into the programmable contact is assisted by a deposition process using silane or silicon tetrachloride as a precursor.

In some embodiments, a temperature of the annealing process is between about 400° C. and about 500° C.

In some embodiments, a temperature of the deposition is between about 370° C. and about 500° C.

In some embodiments, a reagent of the removal process consists of hydrogen peroxide and sulfuric acid in a ratio of 10:1.

Due to the design of the semiconductor device of the present disclosure, the programmable contact may provide an option to change a status of a circuit including the programmable contact and an electrical characteristic of the semiconductor device may be changed accordingly. Through tuning the electrical characteristic of the semiconductor device, the quality of the semiconductor device may be improved. In addition, due to the pair of stress regions, the carrier mobility of the semiconductor device may be increased. Furthermore, due to the air gaps, a parasitic capacitance of the semiconductor device may be reduced.

The foregoing has outlined rather broadly the features and technical advantages of the present disclosure in order that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
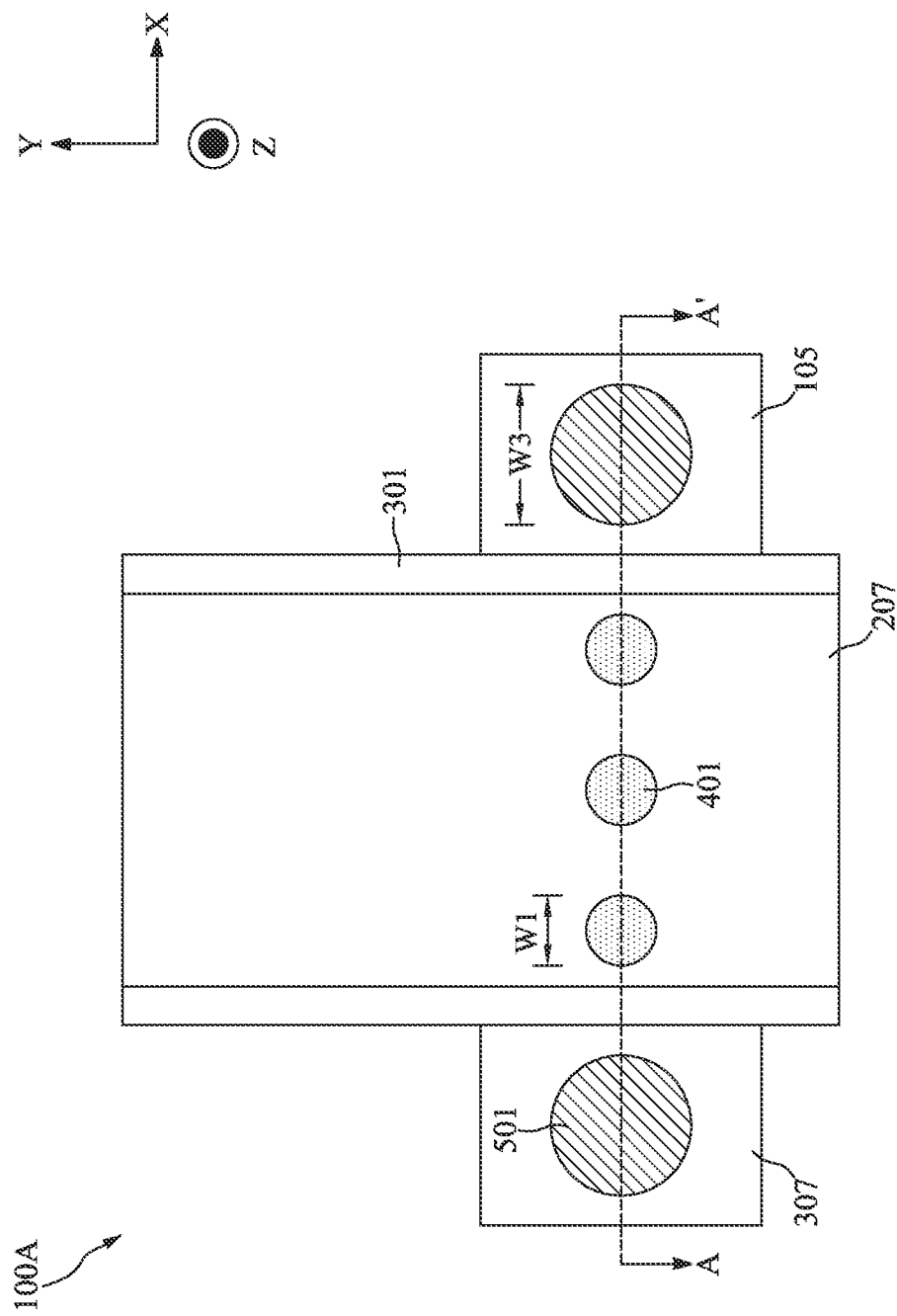
FIG. 1 illustrates, in a schematic top-view diagram, a semiconductor device in accordance with one embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It should be understood that when an element or layer is referred to as being "connected to" or "coupled to" another element or layer, it can be directly connected to or coupled to another element or layer, or intervening elements or layers may be present.

It should be understood that, although the terms first, second, etc. may be used herein to describe various elements, these elements should not be limited by these terms. Unless indicated otherwise, these terms are only used to distinguish one element from another element. Thus, for example, a first element, a first component or a first section discussed below could be termed a second element, a second component or a second section without departing from the teachings of the present disclosure.

Unless the context indicates otherwise, terms such as "same," "equal," "planar," or "coplanar," as used herein when referring to orientation, layout, location, shapes, sizes, amounts, or other measures, do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to reflect this meaning. For example, items described as "substantially the same," "substantially equal," or "substantially planar," may be exactly the same, equal, or planar, or may be the same, equal, or planar within acceptable variations that may occur, for example, due to manufacturing processes.

In the present disclosure, a semiconductor device generally means a device which can function by utilizing semiconductor characteristics, and an electro-optic device, a light-emitting display device, a memory device, a semiconductor circuit, and an electronic device are all included in the category of the semiconductor device.

It should be noted that, in the description of the present disclosure, above (or up) corresponds to the direction of the arrow of the direction Z, and below (or down) corresponds to the opposite direction of the arrow of the direction Z.

Figure 2:
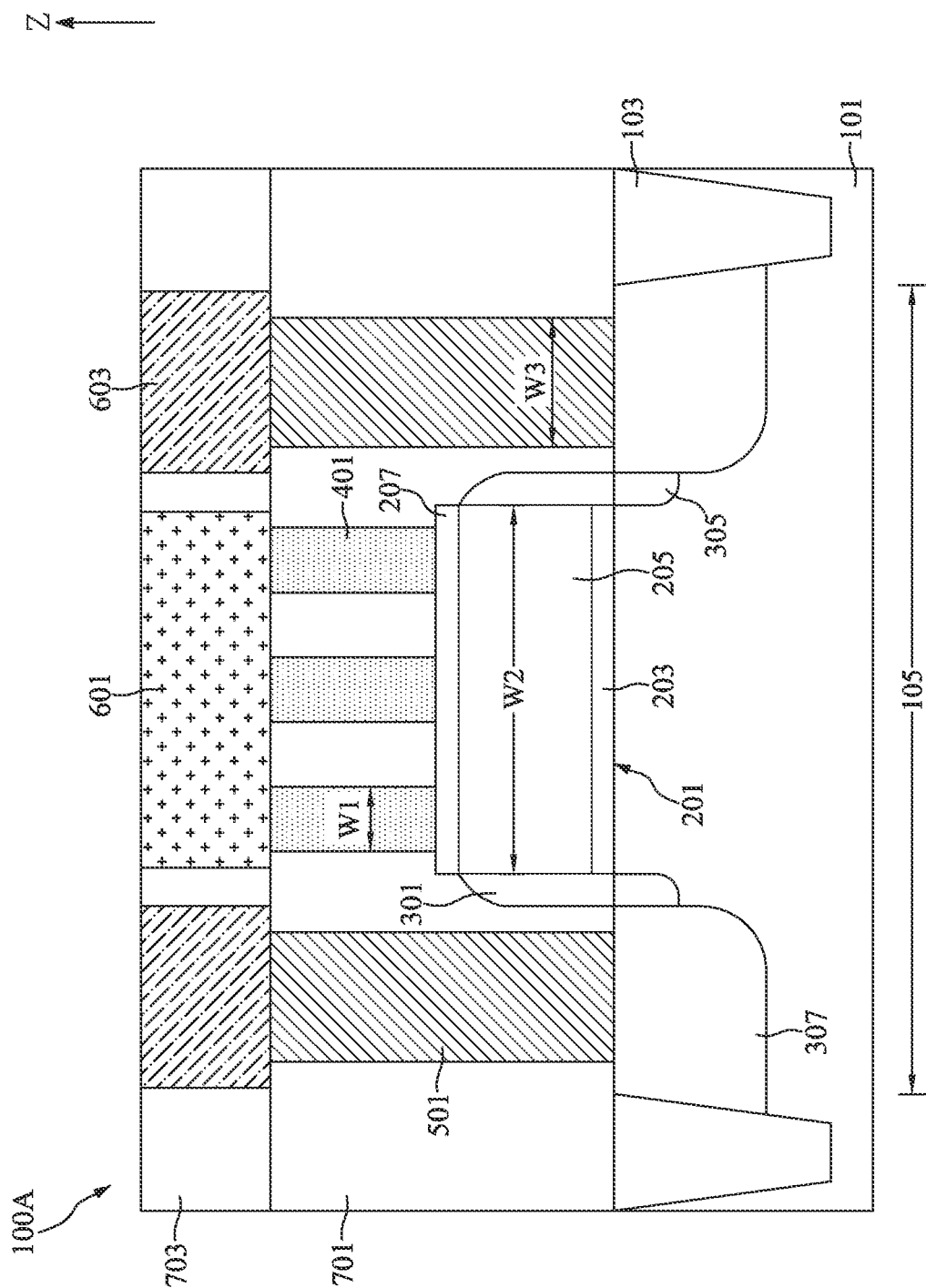
FIG. 2 is a schematic cross-sectional view diagram taken along a line A-A' in FIG. 1.

FIG. 1 illustrates, in a schematic top-view diagram, a semiconductor device 100A in accordance with one embodiment of the present disclosure. FIG. 2 is a schematic cross-sectional view diagram taken along a line A-A' in FIG. 1. Some elements of the semiconductor device 100A of the present disclosure are not shown in FIG. 1 for clarity.

With reference to FIGS. 1 and 2, in the embodiment depicted, the semiconductor device 100A may include a substrate 101, an isolation structure 103, a gate stack 201, a pair of first spacers 301, a pair of lightly-doped regions 305, a pair of heavily-doped regions 307, a plurality of programmable contacts 401, a plurality of first contacts 501, a first conductive layer 601, a plurality of second conductive layers 603, a first insulating layer 701, and a second insulating layer 703.

With reference to FIGS. 1 and 2, in the embodiment depicted, the substrate 101 may be formed of for example, silicon, germanium, silicon germanium, silicon carbon, silicon germanium carbon, gallium, gallium arsenic, indium arsenic, indium phosphorus or other IV-IV, III-V or II-VI semiconductor materials. The substrate 101 may have a first lattice constant and a crystal orientation <111>.

With reference to FIGS. 1 and 2, in the embodiment depicted, the isolation structure 103 may be disposed in the substrate 101 and defines an active area 105 of the substrate 101. (Two isolation structures 103 are shown in FIG. 2, but other quantities of isolation structures may be used in other embodiments.) The isolation structure 103 may be formed of an insulating material such as silicon oxide, silicon nitride, silicon oxynitride, silicon nitride oxide, or fluoride-doped silicate.

With reference to FIGS. 1 and 2, in the embodiment depicted, the first insulating layer 701 and the second insulating layer 703 may be sequentially disposed on the substrate 101. The first insulating layer 701 and the second insulating layer 703 may be formed of, for example, silicon nitride, silicon oxide, silicon oxynitride, flowable oxide, undoped silica glass, borosilica glass, phosphosilica glass, borophosphosilica glass, or a combination thereof, but are not limited thereto. The first insulating layer 701 and the second insulating layer 703 may be formed of a same material, but are not limited thereto.

With reference to FIGS. 1 and 2, in the embodiment depicted, the gate stack 201 may be disposed on the substrate 101 and in the first insulating layer 701. The gate stack 201 may intersect the active area 105 from a top-view perspective. The gate stack 201 may include a gate insulating layer 203, a gate bottom conductive layer 205, and a gate top conductive layer 207. The gate insulating layer 203 may be disposed on the substrate 101 and may intersect the active area 105 from a top-view perspective. The gate insulating layer 203 may have a thickness between about 0.5 nm and about 5.0 nm. Preferably, the thickness of the gate insulating film 203 may be between about 0.5 nm and about 2.5 nm. The gate insulating layer 203 may be formed of, for example, an insulating material such as silicon oxide, silicon nitride, silicon oxynitride, or silicon nitride oxide.

Alternatively, in another embodiment, the insulating material may have a dielectric constant of about 4.0 or greater. Examples for the insulating material may include, but are not limited to, hafnium oxide, hafnium zirconium oxide, hafnium lanthanum oxide, hafnium silicon oxide, hafnium tantalum oxide, hafnium titanium oxide, zirconium oxide, aluminum oxide, aluminum silicon oxide, titanium oxide, tantalum pentoxide, lanthanum oxide, lanthanum silicon oxide, strontium titanate, lanthanum aluminate, yttrium oxide, gallium (III) trioxide, gadolinium gallium oxide, lead zirconium titanate, barium titanate, barium strontium titanate, barium zirconate, or a mixture thereof.

With reference to FIGS. 1 and 2, in the embodiment depicted, the gate bottom conductive layer 205 may be disposed on the gate insulating layer 203 and in the first insulating layer 701. The gate bottom conductive layer 205 may have a thickness between about 50 nm and about 300 nm. The gate bottom conductive layer 205 may be formed of, for example, doped polysilicon. The gate top conductive layer 207 may be disposed on the gate bottom conductive layer 205. The gate top conductive layer 207 may have a thickness between about 2 nm and about 50 nm. The gate top conductive layer 207 may be formed of, for example, a metal silicide. The metal silicide may be nickel silicide, platinum silicide, titanium silicide, molybdenum silicide, cobalt silicide, tantalum silicide, tungsten silicide, or the like.

With reference to FIGS. 1 and 2, in the embodiment depicted, the pair of first spacers 301 may be attached to sidewalls of the gate insulating layer 203 and sidewalls of the gate bottom conductive layer 205. The pair of first spacers 301 may be disposed in the first insulating layer 701. The pair of first spacers 301 may be formed of, for example, silicon oxide, silicon nitride, silicon oxynitride, silicon nitride oxide, or polysilicon.

With reference to FIGS. 1 and 2, in the embodiment depicted, the pair of lightly-doped regions 305 may be disposed adjacent to two sides of the gate stack 201 and in the active area 105 of the substrate 101. Specifically, the pair of lightly-doped regions 305 may be disposed adjacent to the sidewalls of the gate insulating layer 203 and in the active area 105. Portions of the pair of lightly-doped regions 305 may be respectively correspondingly disposed below the pair of first spacers 301. The pair of lightly-doped regions 305 may be doped with a dopant such as phosphorus, arsenic, antimony, boron, or indium.

With reference to FIGS. 1 and 2, in the embodiment depicted, the pair of heavily-doped regions 307 may be disposed adjacent to the two sides of the gate stack 201 and in the active area 105 of the substrate 101. The pair of heavily-doped regions 307 may be respectively correspondingly disposed adjacent to the pair of lightly-doped regions 305. The pair of heavily-doped regions 307 may be doped with a same dopant as the pair of lightly-doped regions 305. The pair of heavily-doped regions 307 may have a dopant concentration greater than that of the pair of lightly-doped regions 305.

With reference to FIGS. 1 and 2, in the embodiment depicted, the plurality of programmable contacts 401 may be disposed on the gate stack 201 and extend in the direction Z. The plurality of programmable contacts 401 may be disposed in the first insulating layer 701. Specifically, the plurality of programmable contacts 401 may be disposed on the gate top conductive layer 207. Any one of the plurality of programmable contacts 401 may have a width W1. A ratio of the width W1 of the programmable contact 401 and a width W2 of the gate top conductive layer 207 is between about 1:2 and about 1:10. It should be noted that the number of the plurality of programmable contacts 401 shown in the figures is for illustration only, and other numbers of the programmable contacts 401 may be employed. Top surfaces of the plurality of programmable contacts 401 may be even with a top surface of the first insulating layer 701. The plurality of programmable contacts 401 may be formed of, for example, silicon or doped silicon. In some embodiments, the plurality of programmable contacts 401 may have a crystal orientation <111>.

With reference to FIGS. 1 and 2, in the embodiment depicted, the plurality of first contacts 501 may be disposed in the first insulating layer 701 and respectively correspondingly on the pair of heavily-doped regions 307. Any one of the plurality of first contacts 501 may have a width W3. The width W3 of the first contact 501 may be greater than the width W1 of the programmable contact 401. The narrower width W1 of the programmable contact 401 may result in a resistivity greater than that of the first contact 501. In the embodiment depicted, as shown in a top-view perspective in FIG. 1, the plurality of programmable contacts 401 and the plurality of first contacts 501 may be disposed at about the same position along the direction Y as the line A-A'. The plurality of first contacts 501 may be formed of, for example, a conductive material such as doped polysilicon, metal, metal nitride, or metal silicide. The metal may be aluminum, copper, tungsten, or cobalt.

With reference to FIGS. 1 and 2, in the embodiment depicted, the first conductive layer 601 and the plurality of second conductive layers 603 may be respectively disposed in the second insulating layer 703. The first conductive layer 601 may be disposed on the plurality of programmable contacts 401. It should be noted that all of the plurality of programmable contacts 401 may be electrically connected to the first conductive layer 601. The plurality of second conductive layers 603 may be respectively correspondingly disposed on the plurality of first contacts 501.

Figure 7:
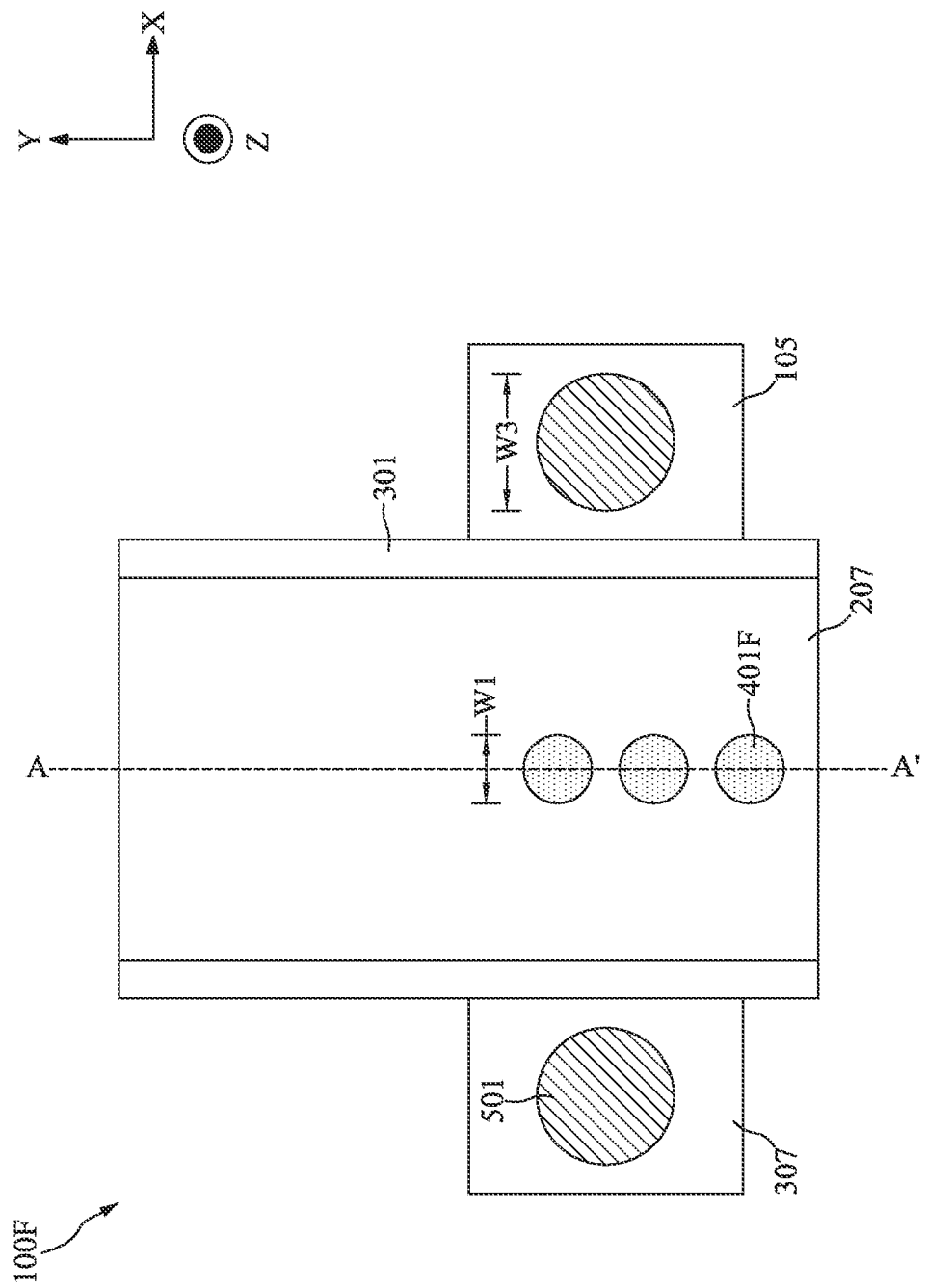
FIGS. 7 to 9 illustrate, in schematic top-view diagrams, semiconductor devices in accordance with other embodiments of the present disclosure.
Figure 8:
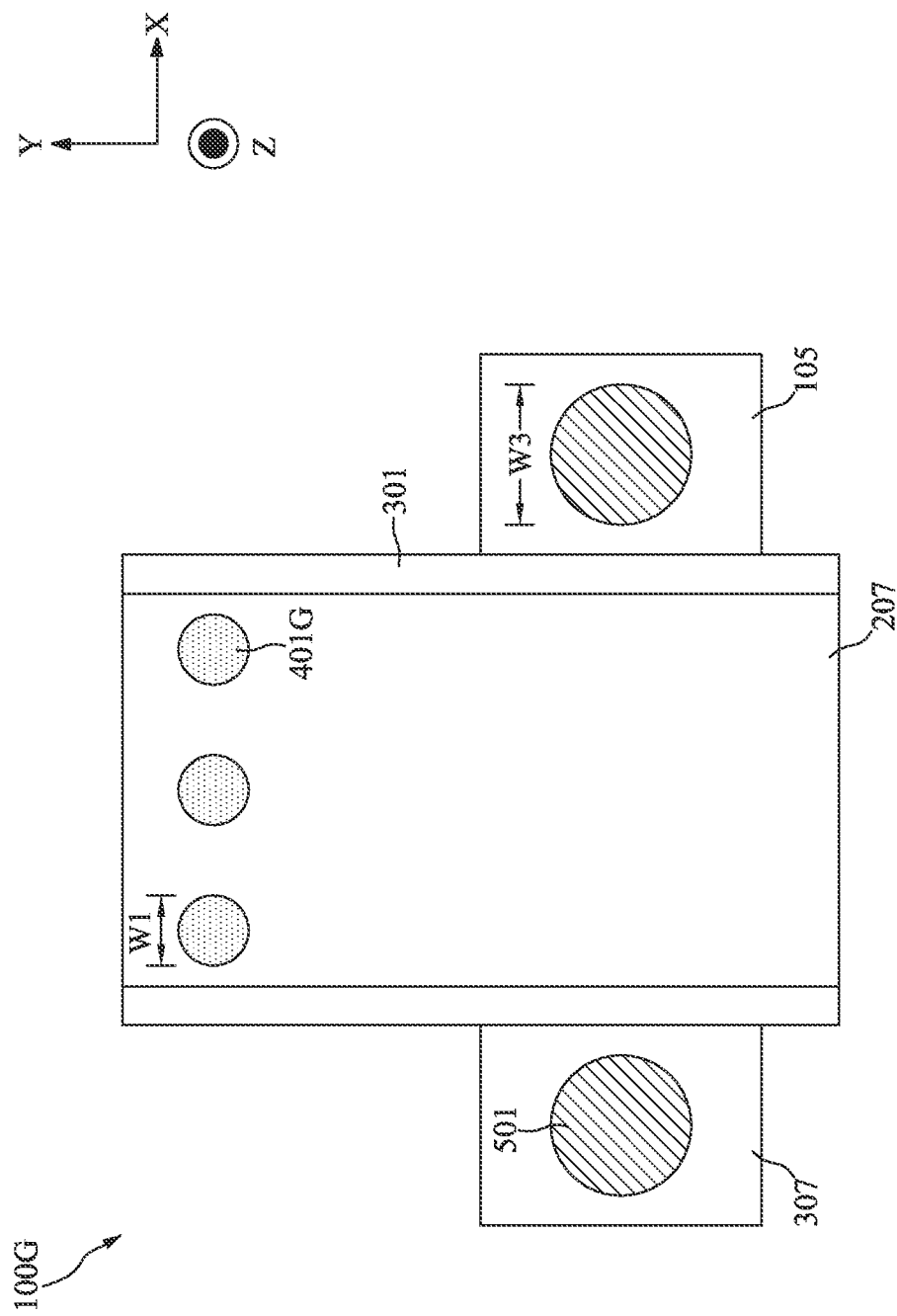
Figure 9:
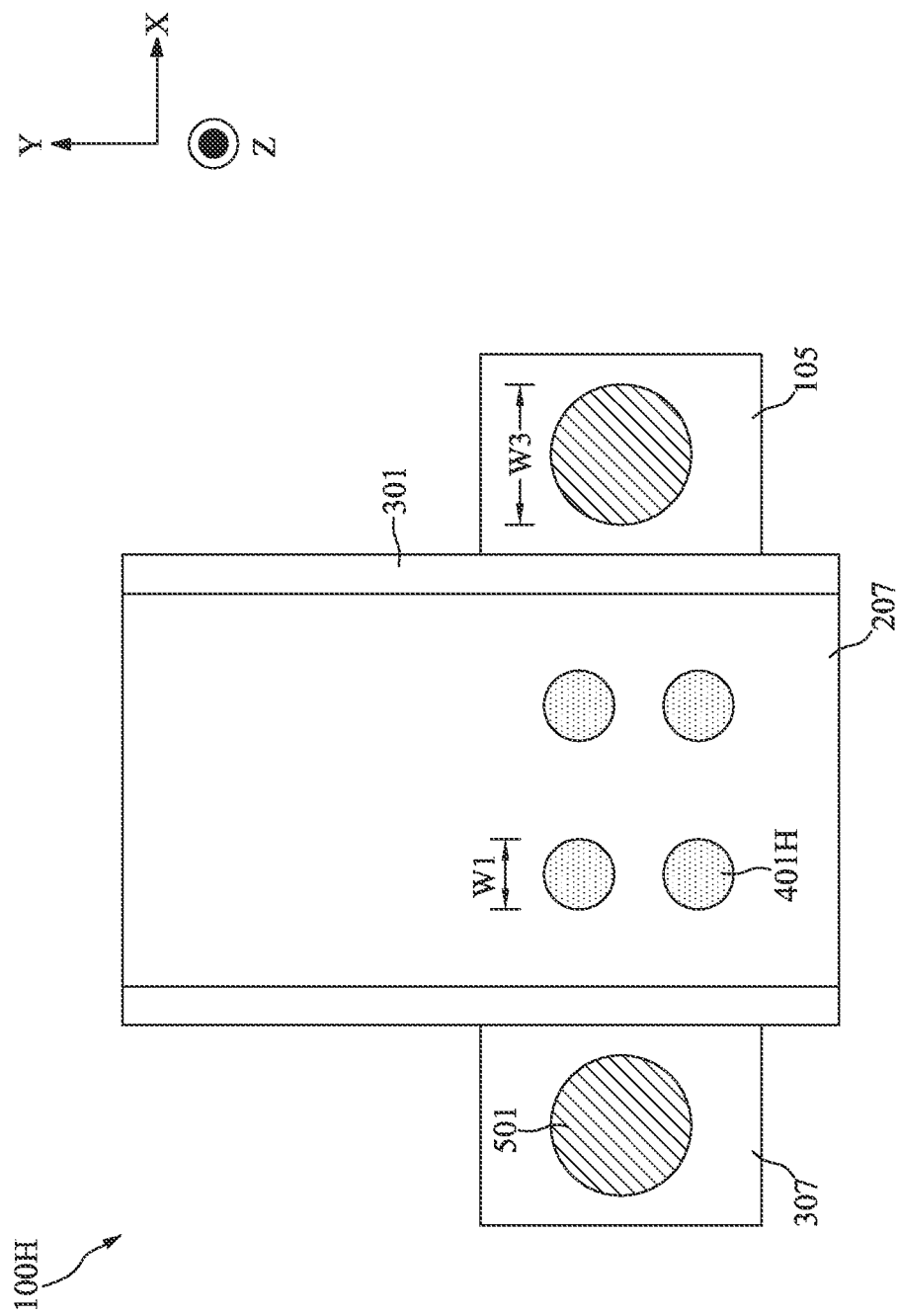

FIGS. 3 to 6 are schematic cross-sectional view diagrams taken along the line A-A' in FIG. 1 for semiconductor devices 100B, 100C, 100D, and 100E in accordance with other embodiments of the present disclosure. FIGS. 7 to 9 illustrate, in schematic top-view diagrams, semiconductor devices 100F, 100G, and 100H in accordance with other embodiments of the present disclosure.

Figure 3:
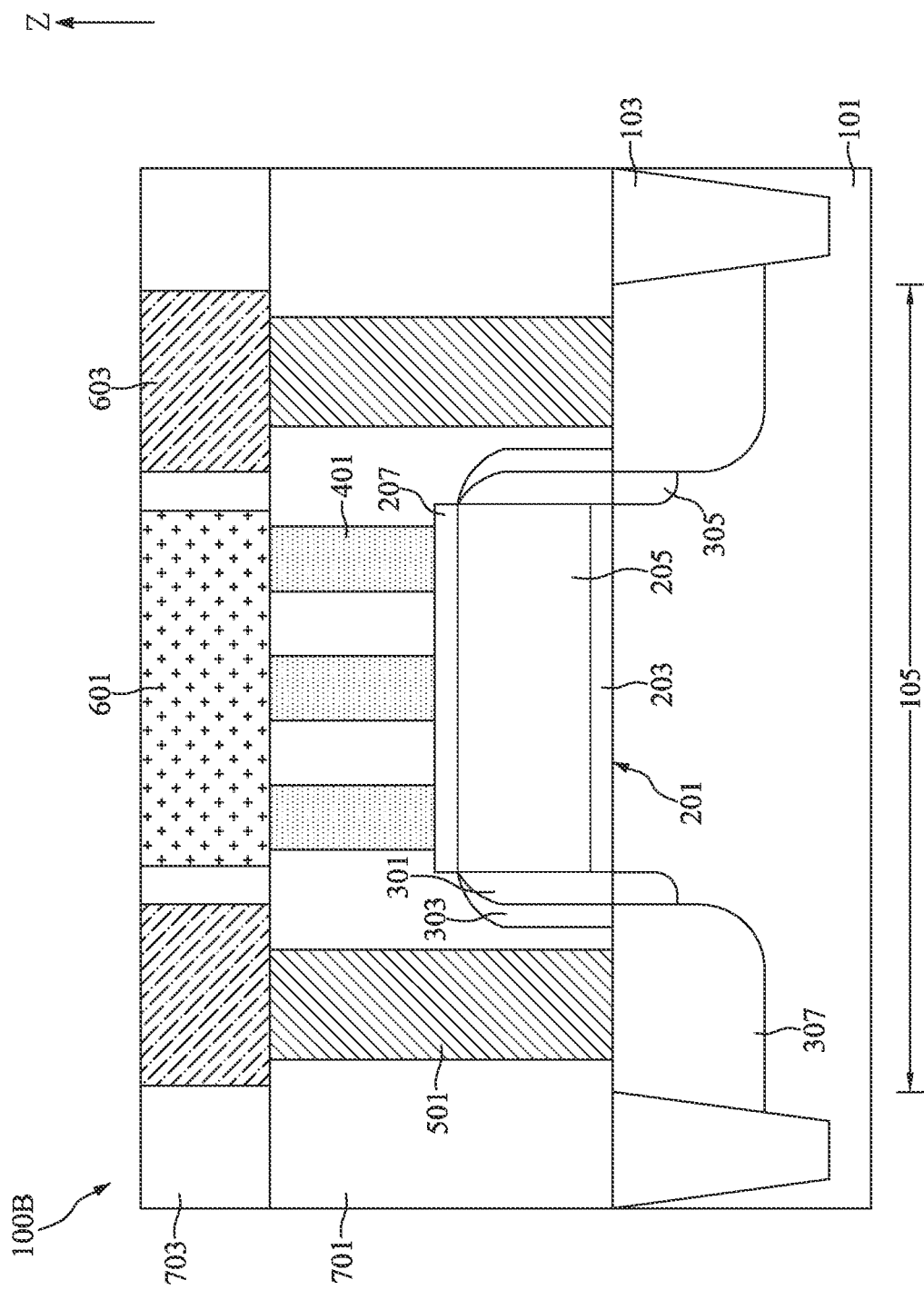
FIGS. 3 to 6 are schematic cross-sectional view diagrams taken along the line A-A' in FIG. 1 for semiconductor devices in accordance with other embodiments of the present disclosure.

With reference to FIG. 3, the semiconductor device 100B may include a pair of second spacers 303. The pair of second spacers 303 may be attached to sidewalls of the pair of first spacers 301. The pair of second spacers 303 may be opposite to the gate stack 201 with the pair of first spacers 301 interposed therebetween. The pair of second spacers 303 may be formed of, for example, silicon oxide. Due to the pair of second spacers 303, a thickness of the pair of first spacers 301 may be minimized, thereby reducing overlap capacitance formed between the pair of heavily-doped regions 307 and the gate stack 201.

Figure 4:
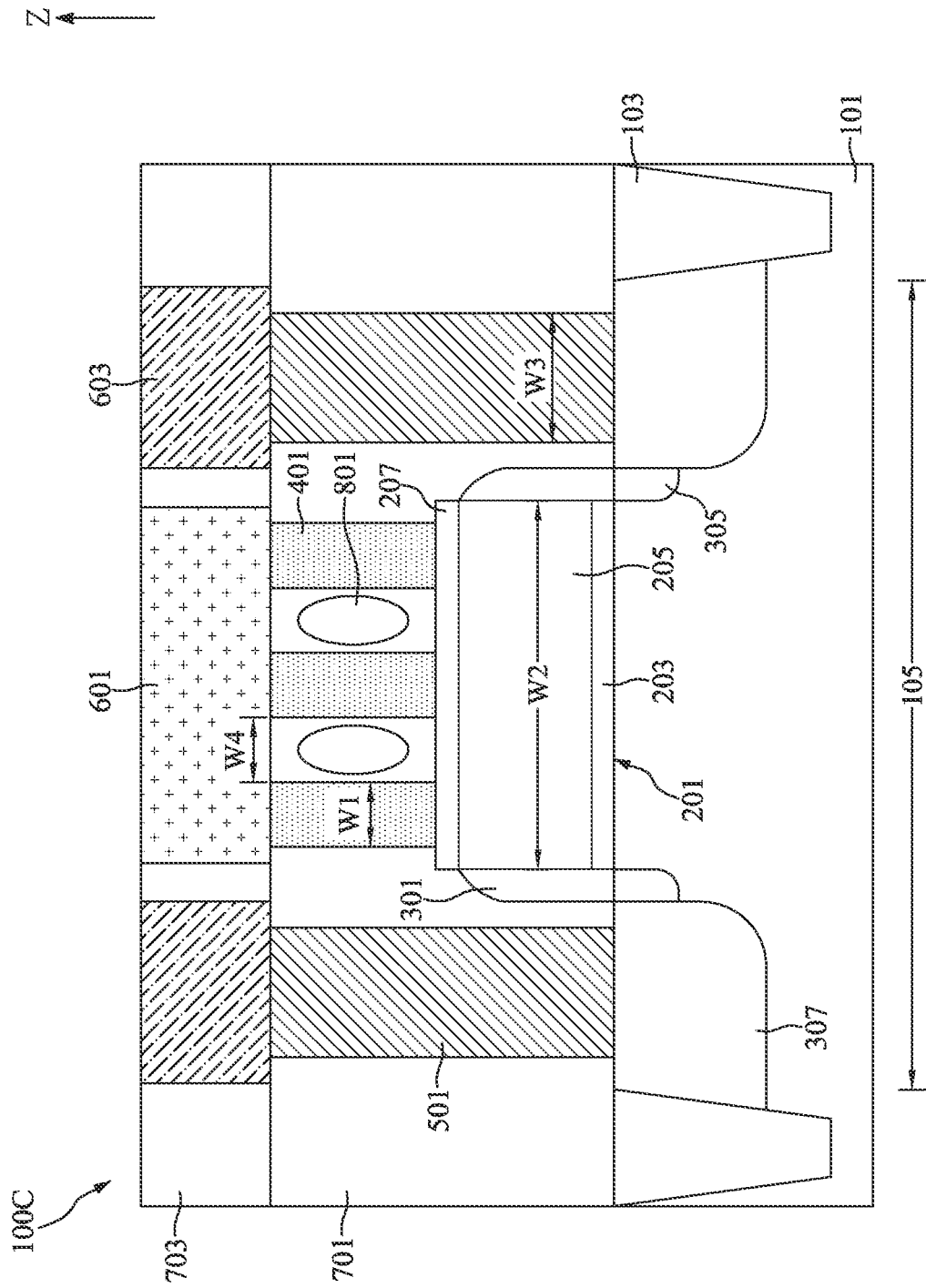

With reference to FIG. 4, the semiconductor device 100C may include a plurality of air gaps 801. The plurality of air gaps 801 may be disposed between adjacent pairs of the plurality of programmable contacts 401. The plurality of air gaps 801 may be formed in narrow spaces between the adjacent pairs of the plurality of programmable contacts 401. A ratio between a width W4 of the narrow space between the adjacent pairs of the plurality of programmable contacts 401 and the width W2 of the gate top conductive layer 207 may be between about 1:10 and about 1:15. The plurality of air gaps 801 may significantly alleviate an interference effect originating from a parasitic capacitance between the adjacent pairs of the plurality of programmable contacts 401.

Figure 5:
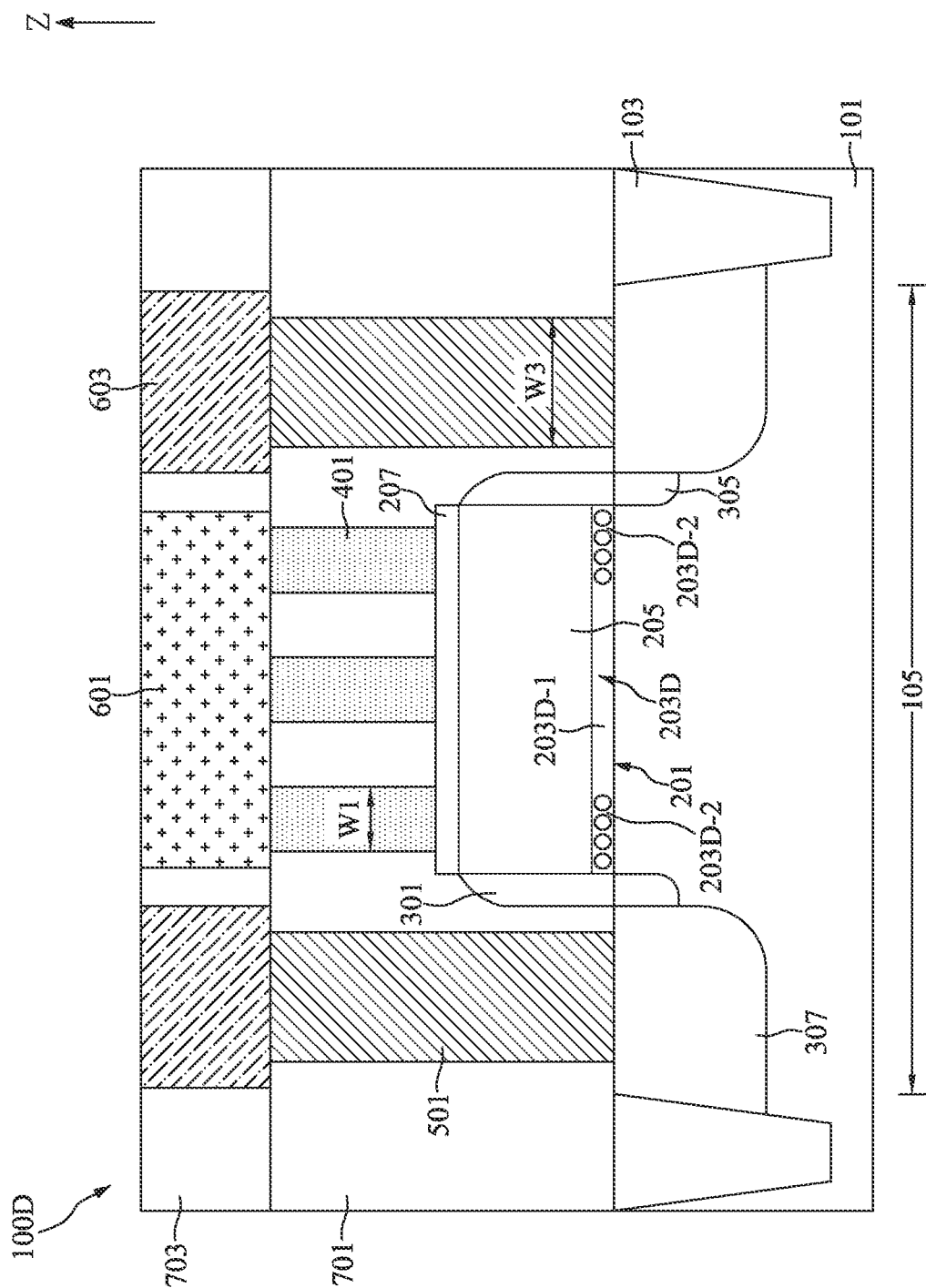

With reference to FIG. 5, the gate insulating layer 203D of the semiconductor device 100D may include a center portion 203D-1 and two end portions 203D-2 respectively connected to two ends of the center portion 203D-1. The two end portions 203D-2 may have a greater concentration of oxygen than the center portion 203D-1. The greater concentration of oxygen at the two end portions 203D-2 of the gate insulating layer 203D may increase a dielectric constant of the gate insulating layer 203D. As a result, the leakage current of the semiconductor device 100D may be reduced. The greater concentration of oxygen of the two end portions 203D-2 may be formed by a lateral oxidation process in an oxidizing environment including oxidizing species. A process temperature of the lateral oxidation process may be between about 300° C. and about 600° C. A partial pressure of oxygen of the lateral oxidation process may be between about 100 mTorr and about 20 atm. A duration of the lateral oxidation process may between about 10 minutes and about 6 hours. The oxidizing species may be molecules including oxygen such as molecular oxygen, water vapor, nitric oxide, or nitrous oxide.

Figure 6:
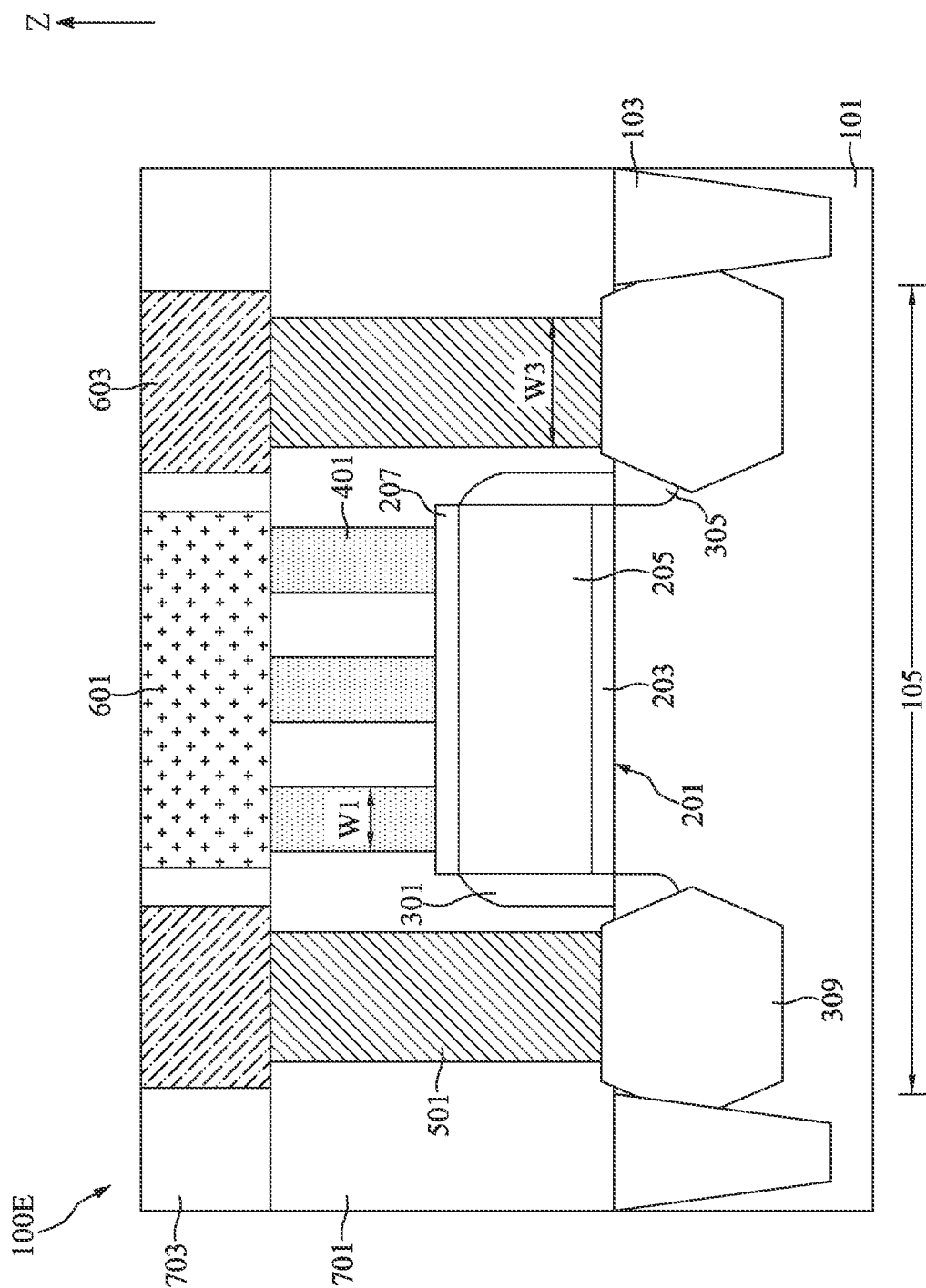

With reference to FIG. 6, the semiconductor device 100E may include a pair of stress regions 309. The pair of stress regions 309 may be disposed adjacent to the two sides of the gate stack 201 and in the active area 105 of the substrate 101. The pair of stress regions 309 may be respectively correspondingly disposed adjacent to the pair of lightly-doped regions 305. The pair of stress regions 309 may have a second lattice constant which is different from the first lattice constant of the substrate 101. The pair of stress regions 309 may be formed of, for example, silicon germanium or silicon carbide. The second lattice constant of the pair of stress regions 309 is different from the first lattice constant of the substrate 101; therefore, the carrier mobility of the semiconductor device 100E may be increased, and the performance of the semiconductor device 100E may be improved.

With reference to FIG. 7, in the semiconductor device 100F, as shown in a top-view perspective, the plurality of programmable contacts 401F may be disposed along a line A-A' along the direction Y. With reference to FIG. 8, in the semiconductor device 100G and as shown in a top-view perspective, the plurality of programmable contacts 401G and the plurality of first contacts 501 may be disposed at different positions along the direction Y. With reference to FIG. 9, in the semiconductor device 100H, as shown in a top-view perspective, the plurality of programmable contacts 401H may be disposed at different positions along the direction X and the direction Y.

Figure 10:
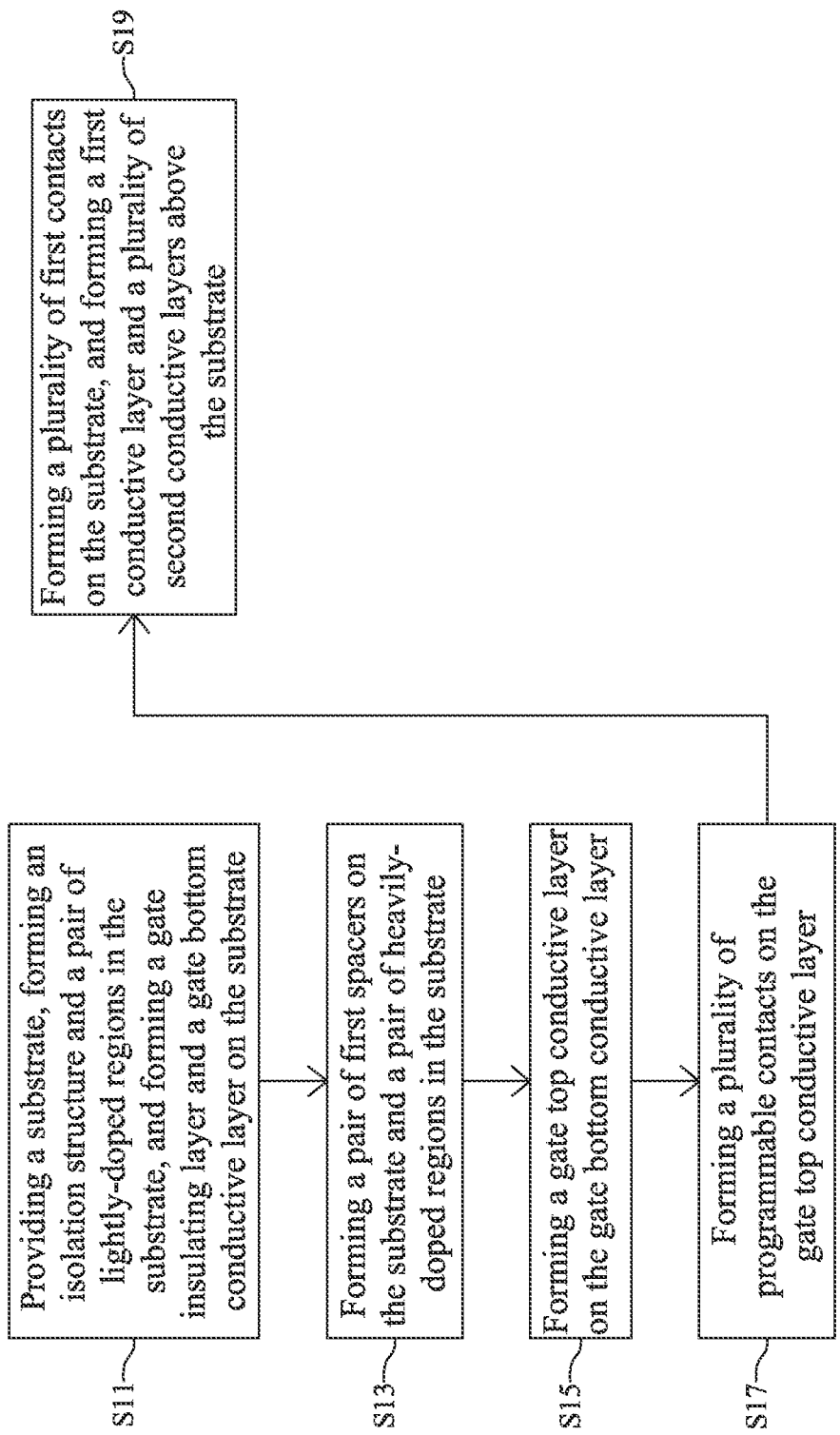
FIG. 10 illustrates, in a flowchart diagram form, a method for fabricating a semiconductor device in accordance with one embodiment of the present disclosure.

FIG. 10 illustrates, in a flowchart diagram form, a method 30 for fabricating a semiconductor device 100A in accordance with one embodiment of the present disclosure. FIGS. 11 to 17 illustrate, in schematic cross-sectional view diagrams, a flow for fabricating the semiconductor device 100A in accordance with one embodiment of the present disclosure.

It should be noted that the terms "forming," "formed" and "form" may mean and include any method of creating, building, patterning, implanting, or depositing an element, a dopant or a material. Examples of forming methods may include, but are not limited to, atomic layer deposition, chemical vapor deposition, physical vapor deposition, sputtering, co-sputtering, spin coating, diffusing, depositing, growing, implantation, photolithography, dry etching, and wet etching.

Figure 11:
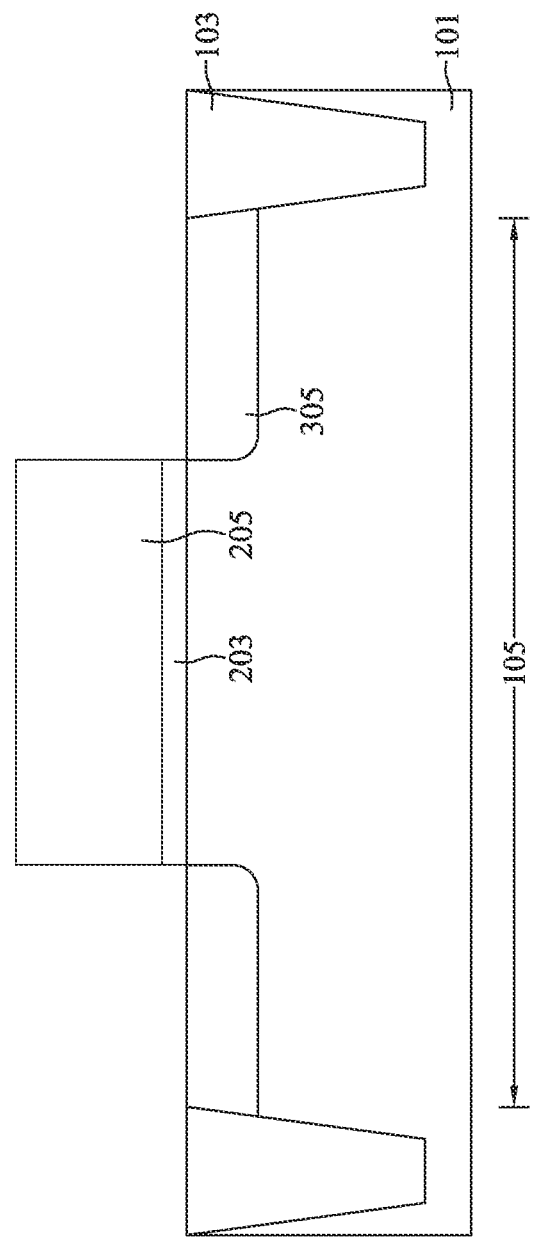
FIGS. 11 to 17 illustrate, in schematic cross-sectional view diagrams, a flow for fabricating the semiconductor device in accordance with one embodiment of the present disclosure.

With reference to FIGS. 10 and 11, at step S1, in the embodiment depicted, a substrate 101 may be provided, an isolation structure 103 and a pair of lightly-doped regions 305 may be formed in the substrate 101, and a gate insulating layer 203 and a gate bottom conductive layer 205 may be formed on the substrate 101. The isolation structure 103 may define an active area 105. The gate insulating layer 203 may be formed on the substrate 101. The gate bottom conductive layer 205 may be formed on the gate insulating layer 203. The pair of lightly-doped regions 305 may be formed adjacent to two sides of the gate insulating layer 203 and in the substrate 101.

Figure 12:
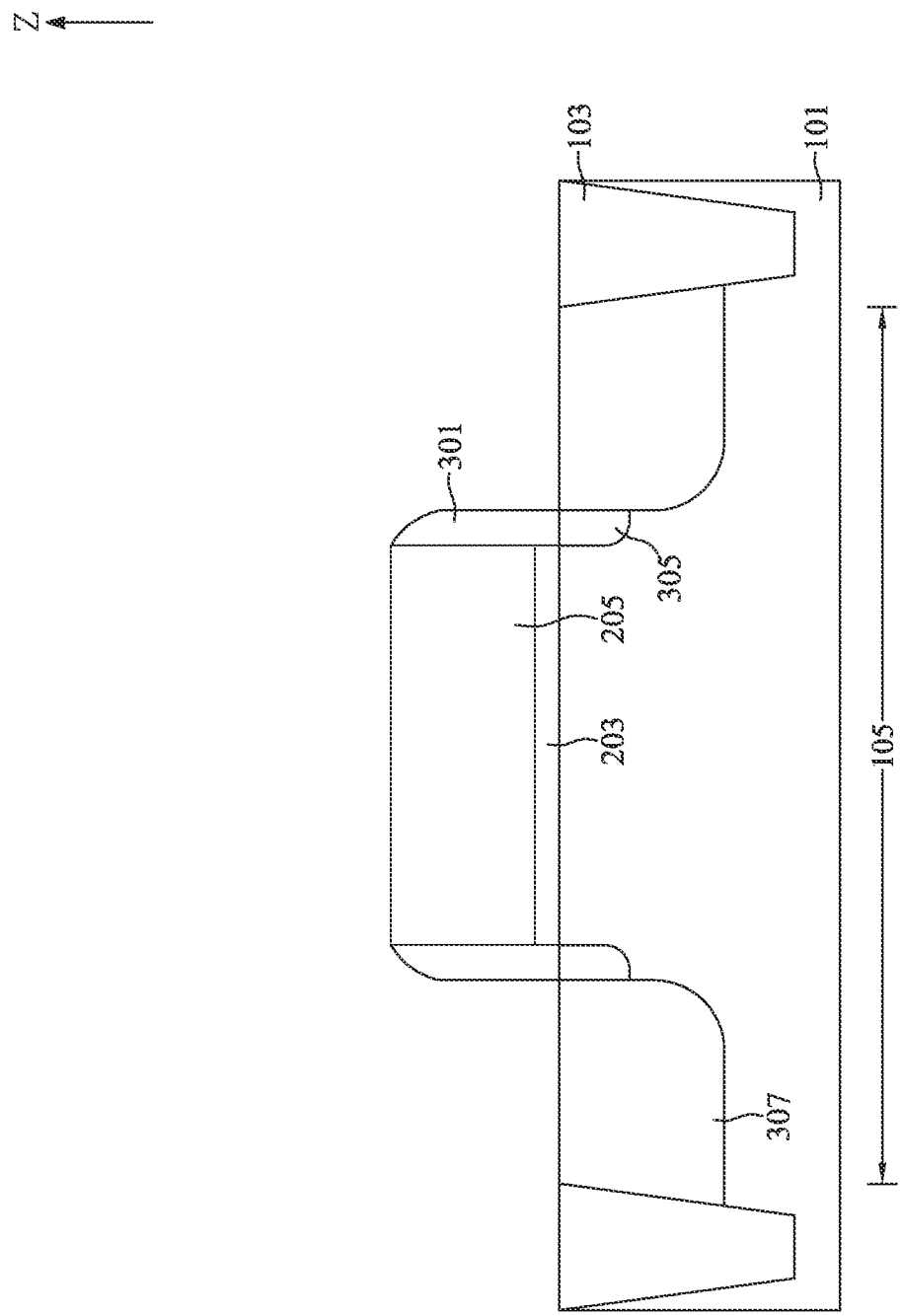

With reference to FIGS. 10 and 12, at step S13, in the embodiment depicted, a pair of first spacers 301 may be formed on the substrate 101 and a pair of heavily-doped regions 307 may be formed in the substrate 101. A first spacer film may be formed over the substrate 101 and the gate bottom conductive layer 205. An etch process, such as an anisotropic dry etch process, may be performed to remove portions of the first spacer film and concurrently form the pair of first spacers 301 attached to sidewalls of the gate bottom conductive layer 205 and the gate insulating layer 203.

Figure 13:
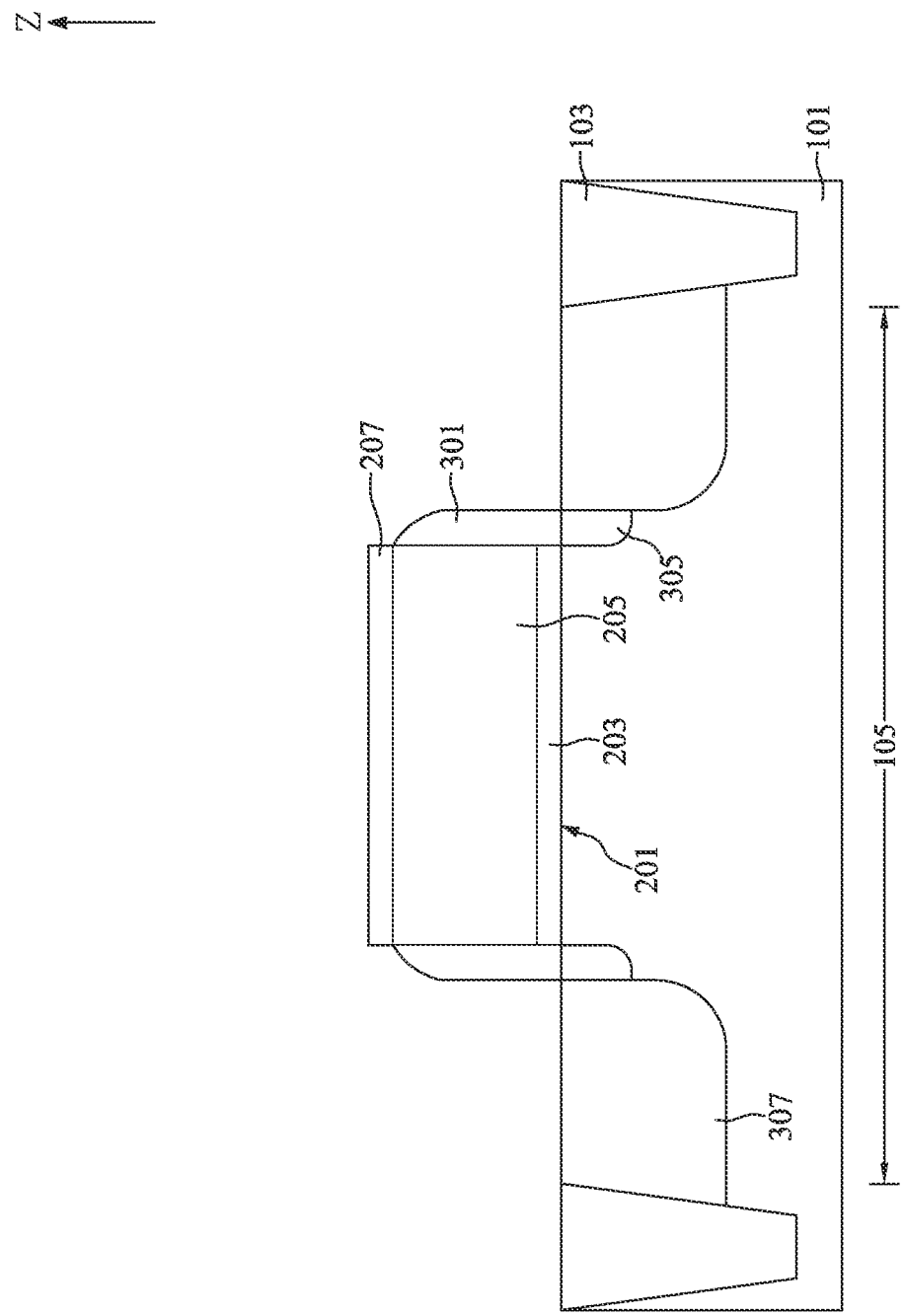

With reference to FIGS. 10 and 13, at step S15, in the embodiment depicted, a gate top conductive layer 207 may be formed on the gate bottom conductive layer 205. A gate top conductive film may be deposited over the substrate 101, the gate bottom conductive layer 205, and the pair of first spacers 301. The gate top conductive film may be formed of, for example, nickel, platinum, titanium, molybdenum, cobalt, tantalum, or tungsten. An annealing process may be performed to react the gate top conductive film with the gate bottom conductive layer 205 and form the gate top conductive layer 207 formed of metal silicide such as nickel silicide, platinum silicide, titanium silicide, molybdenum silicide, cobalt silicide, tantalum silicide, or tungsten silicide. The annealing process may be one step or two steps. When the two-step annealing process is performed, a temperature of the first step may be lower than a temperature of the second step. After the annealing process, a removal process may be performed to remove unreacted portions of the gate top conductive film. The gate insulating layer 203, the gate bottom conductive layer 205, and the gate top conductive layer 207 together form a gate stack 201.

When the gate top conductive film is formed of nickel, the gate top conductive layer 207 may be formed of nickel silicide. Nickel silicide may be NiSi or $NiSi_2$. When the NiSi is employed, a temperature of the annealing process may be between about 400° C. about 500° C. When the $NiSi_2$ is employed, a temperature of the annealing process may be above 750° C. The removal process may be performed with a removal regent consisting of hydrogen peroxide and sulfuric acid in a ratio of 10:1. A process temperature of the removal process may be about 55° C. to 75° C. A process duration of the removal process may be between about 8 minutes and about 15 minutes.

Figure 14:
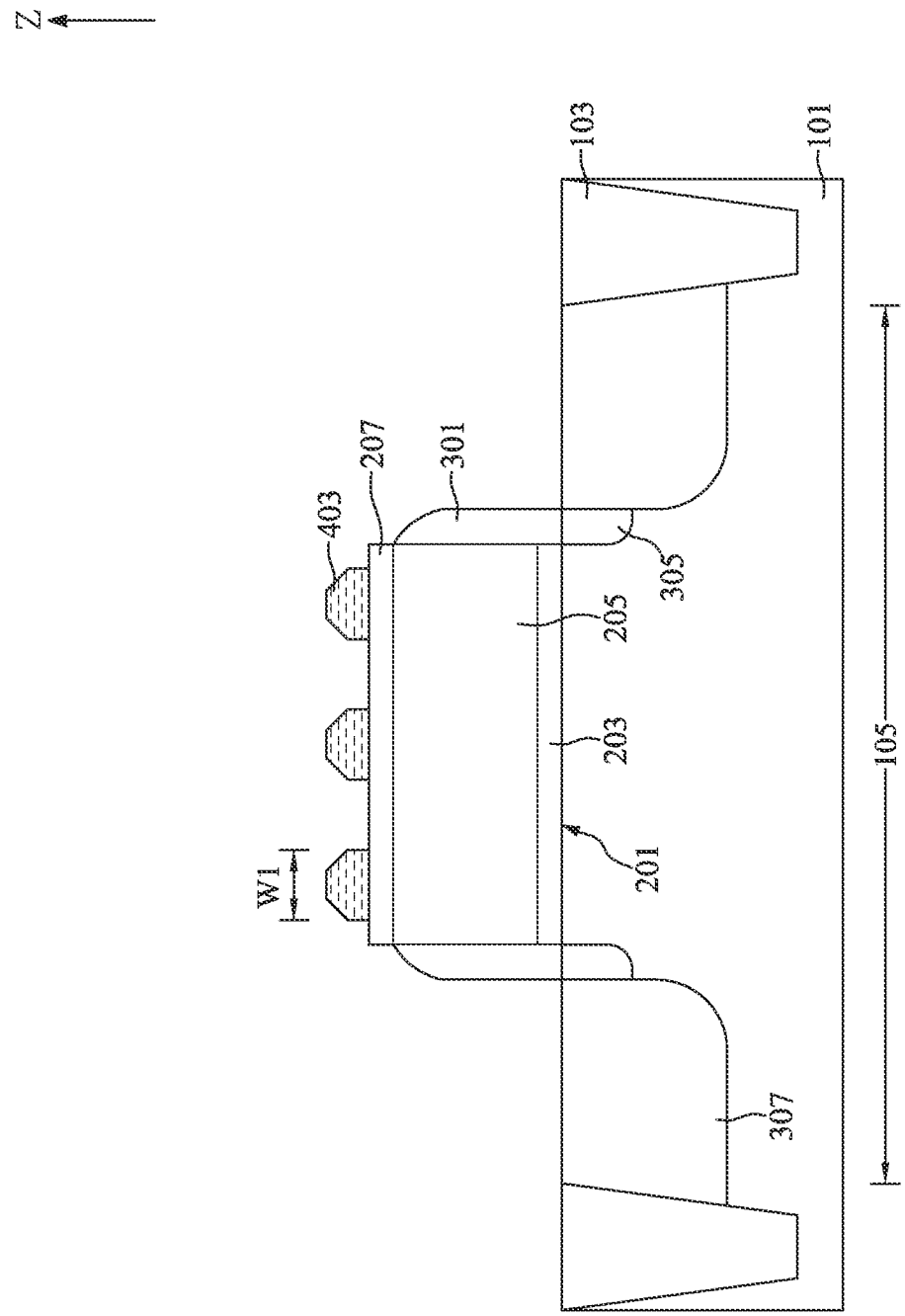

With reference to FIGS. 10 and 14 to 16, at step S17, in the embodiment depicted, a plurality of programmable contacts 401 may be formed on the gate top conductive layer 207. With reference to FIG. 14, a plurality of catalyst units 403 may be formed on the gate top conductive layer 207. The plurality of catalyst units 403 may be formed of, for example, aluminum, gold, titanium, nickel, or gallium. The plurality of catalyst units 403 may be formed by patterning a catalyst film into dots (i.e., the plurality of catalyst units 403) or by dispensing a colloid containing aluminum, gold, titanium, nickel, or gallium. Other methods are also possible. For example, a thin catalyst film may agglomerate into separated catalyst units 403 if annealed at a temperature above 350° C.

Figure 15:
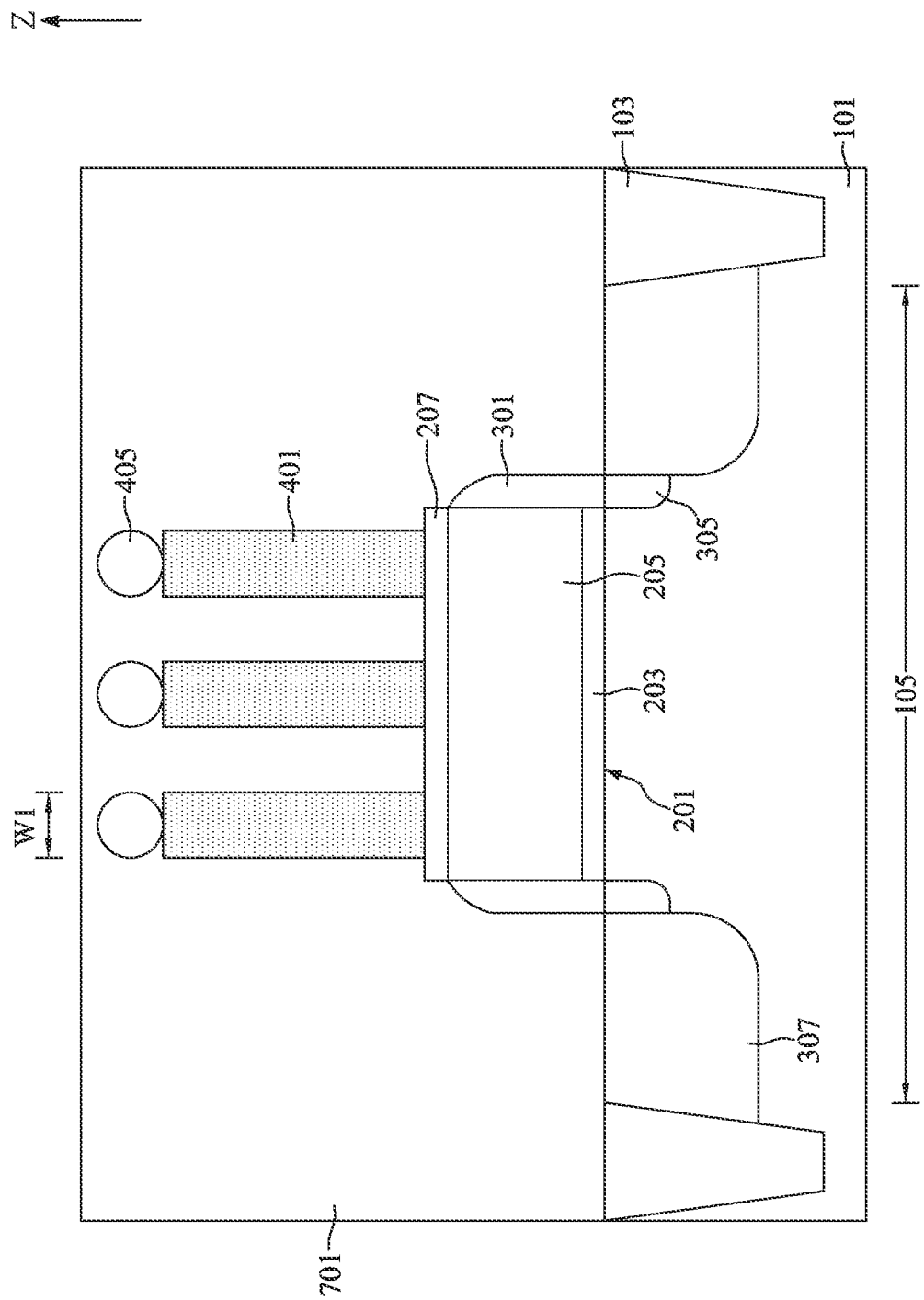

With reference to FIG. 15, the plurality of catalyst units 403 may grow perpendicular to the top surface of the gate top conductive layer 207 and form the plurality of programmable contacts 401 with assistance of a deposition process such as chemical vapor deposition or a plasma-enhanced chemical vapor deposition. During the deposition process, a dopant such as phosphorus, arsenic, antimony, boron, or indium may be used for in-situ doping of the plurality of programmable contacts 401. A precursor of the deposition process may be silane or silicon tetrachloride. When silane is employed as the precursor, a temperature of the deposition process may be between about 370° C. and about 500° C. When silicon tetrachloride is employed as the precursor, a temperature of the deposition process may be between about 800° C. and about 950° C.

The growth of the plurality of programmable contacts 401 may be described as a vapor-liquid-solid mechanism. In the beginning of the growth process, catalyst-silicon liquid alloy droplets 405 are formed. With an additional supply of silicon from the gas phase, the catalyst-silicon liquid alloy droplets 405 become supersaturated with silicon and the excess silicon is deposited at the solid-liquid interface. As a result, the catalyst-silicon liquid alloy droplets 405 are raised from the top surface of the gate top conductive layer 207 to the tops of the plurality of programmable contacts 401.

Figure 16:
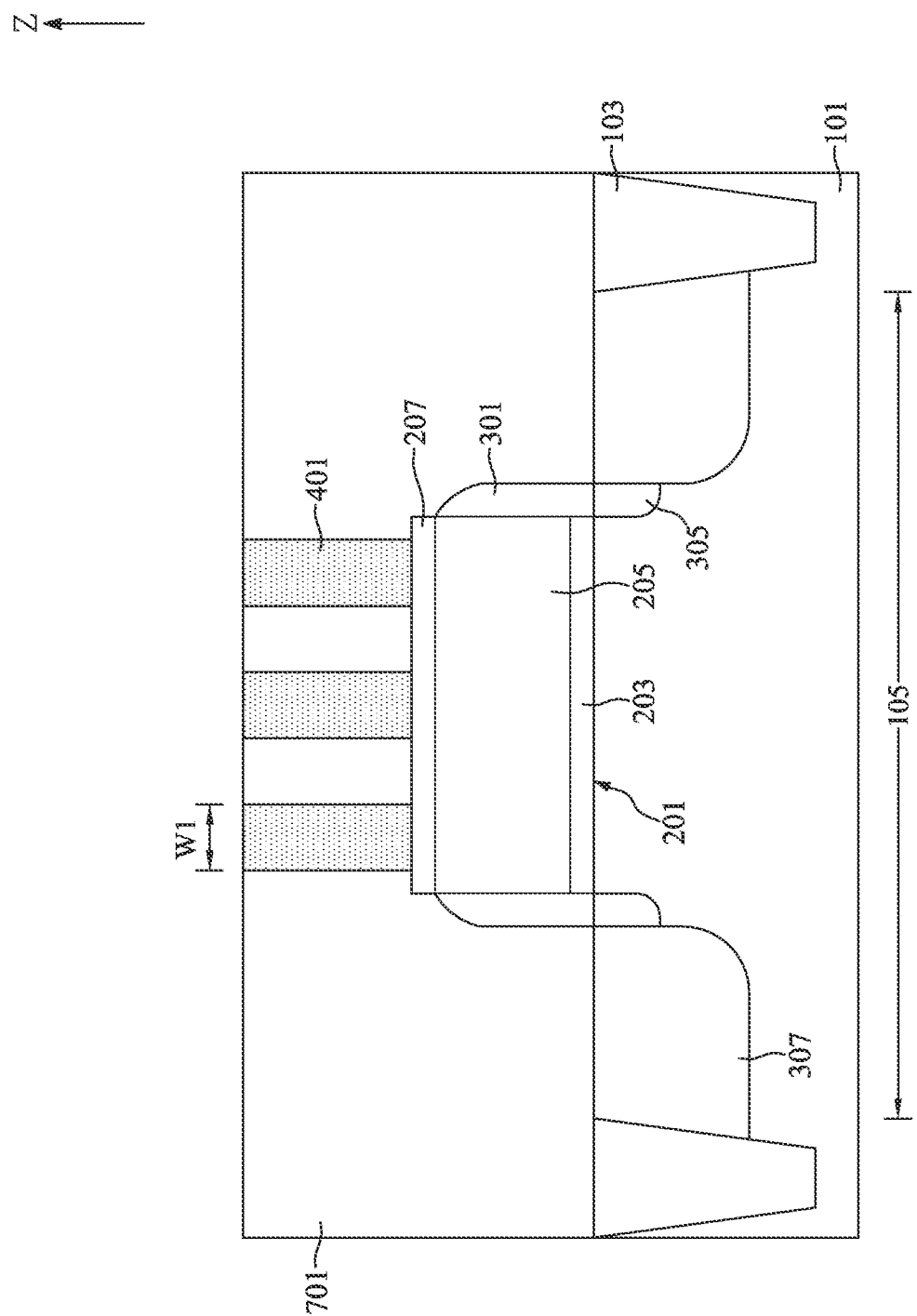

With reference to FIG. 15, a first insulating layer 701 may be deposited after the forming of the plurality of programmable contacts 401. With reference to FIG. 16, a planarization process, such as chemical mechanical polishing, may be performed to provide a substantially flat surface for subsequent processing steps. Top surfaces of the plurality of programmable contacts 401 may be even with a top surface of the first insulating layer 701.

Figure 17:
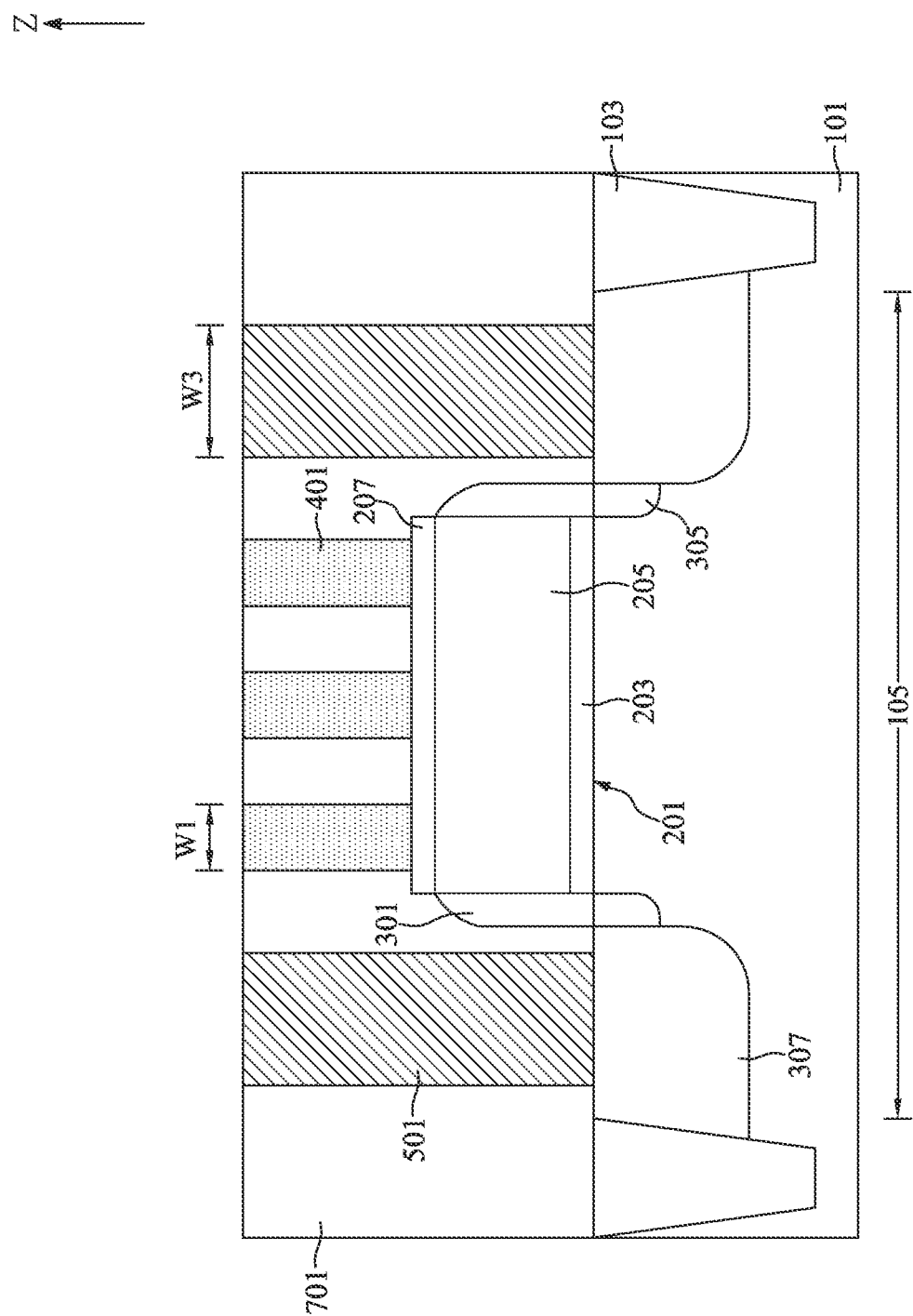

With reference to FIGS. 1, 2, 10, and 17, at step S19, in the embodiment depicted, a plurality of first contacts 501 may be formed on the substrate 101, and a first conductive layer 601 and a plurality of second conductive layers 603 may be formed above the substrate 101. With reference to FIG. 17, the plurality of first contacts 501 may be formed on the pair of heavily-doped regions 307 and in the first insulating layer 701 by a damascene process. With reference back to FIGS. 1 and 2, a second insulating layer 703 may be formed on the first insulating layer 701. The first conductive layer 601 may be formed on the plurality of programmable contacts 401 and the plurality of second conductive layers 603 may be respectively correspondingly formed on the plurality of first contacts 501 by another damascene process.

Due to the design of the semiconductor device of the present disclosure, the plurality of programmable contacts 401 may have a resistivity greater than that of the plurality of first contacts 501. Hence, when a greater voltage such as a programmable voltage is applied, the plurality of programmable contacts 401 may be blown and a circuit including the plurality of programmable contacts 401 may be opened. That is, the plurality of programmable contacts 401 may provide an option to change a status of the circuit including the plurality of programmable contacts 401, and an electrical characteristic of the semiconductor device 100A may be accordingly changed. Through tuning the electrical characteristic of the semiconductor device 100A, the quality of the semiconductor device 100A may be improved.

One aspect of the present disclosure provides a semiconductor device including a substrate, a gate stack positioned on the substrate, a plurality of programmable contacts positioned on the gate stack, a pair of heavily-doped regions positioned adjacent to two sides of the gate stack and in the substrate, and a plurality of first contacts positioned on the pair of heavily-doped regions. A width of the plurality of programmable contacts is less than a width of the plurality of first contacts.

Another aspect of the present disclosure provides a semiconductor device including a substrate, a gate stack positioned on the substrate, a plurality of programmable contacts positioned on the gate stack, a pair of stress regions positioned adjacent to two sides of the gate stack and in the substrate, and a plurality of first contacts positioned on the pair of stress regions. A width of the plurality of programmable contacts is less than a width of the plurality of first contacts.

Another aspect of the present disclosure provides a method for fabricating a semiconductor device including providing a substrate, forming a gate stack on the substrate and a pair of heavily-doped regions in the substrate, forming a programmable contact having a first width on the gate stack, and forming a first contact having a second width, which is greater than the first width, on one of the pair of heavily-doped regions.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein, may be utilized according to the present disclosure. Accordingly, the appended claims are intended to include within their scope such processes, machines, manufacture, compositions of matter, means, methods, and steps.

What is claimed is:

1. A method for fabricating a semiconductor device, comprising:
   providing a substrate;
   forming a gate stack on the substrate and a pair of heavily-doped regions in the substrate;
   forming a programmable contact having a first width on the gate stack;
   forming a first contact having a second width, which is greater than the first width, on one of the pair of heavily-doped regions;
   wherein forming the gate stack on the substrate comprises:
      forming a gate insulating layer on the substrate;
      forming a gate bottom conductive layer on the gate insulating layer; and
      forming a gate top conductive layer on the gate bottom conductive layer;
   wherein forming the programmable contact having the first width on the gate stack comprises:
      forming catalyst units on the gate top conductive layer; and
      growing the catalyst units into the programmable contact.

2. The method for fabricating the semiconductor device of claim 1, wherein forming the gate top conductive layer on the gate bottom conductive layer comprises:
   forming a gate top conductive film over the substrate and the gate bottom conductive layer;
   performing an annealing process to form the gate top conductive layer; and
   performing a removal process.

3. The method for fabricating the semiconductor device of claim 2, wherein growing the catalyst units into the programmable contact is assisted by a deposition process using silane or silicon tetrachloride as a precursor.

4. The method for fabricating the semiconductor device of claim 3, wherein a temperature of the annealing process is between about 400° C. and about 500° C.

5. The method for fabricating the semiconductor device of claim 4, wherein a temperature of the deposition is between about 370° C. and about 500° C.

6. The method for fabricating the semiconductor device of claim 5, wherein a reagent of the removal process consists of hydrogen peroxide and sulfuric acid in a ratio of 10:1.

* * * * *